(12) United States Patent
Yeap et al.

(10) Patent No.: US 7,242,590 B1
(45) Date of Patent: Jul. 10, 2007

(54) ELECTRONIC INSTRUMENT SYSTEM WITH MULTIPLE-CONFIGURATION INSTRUMENT MODULES

(75) Inventors: Boon Leong Yeap, Penang (MY); Shiew Foe Foo, Penang (MY); Cheo Bong Lim, Penang (MY); Eng Su Tay, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/376,075

(22) Filed: Mar. 15, 2006

(51) Int. Cl.
*H05K 5/00* (2006.01)
(52) U.S. Cl. .................... 361/752; 361/796; 361/728; 361/802; 361/733; 361/800; 174/384; 174/390
(58) Field of Classification Search ............... 361/600, 361/683, 686, 724–733, 748–803; 702/108; 326/16; 713/1, 100, 300, 400; 709/201; 710/14
See application file for complete search history.

(56) References Cited

U.S. PATENT DOCUMENTS

| | | | | |
|---|---|---|---|---|
| 4,771,403 A | * | 9/1988 | Maskovyak et al. | 710/14 |
| 6,028,769 A | * | 2/2000 | Zurek | 361/704 |
| 6,850,415 B2 | * | 2/2005 | Dimarco | 361/752 |
| 6,859,882 B2 | * | 2/2005 | Fung | 713/300 |
| 2002/0012237 A1 | * | 1/2002 | Dimarco | 361/796 |
| 2003/0070827 A1 | * | 4/2003 | Daub et al. | 174/35 R |
| 2006/0144396 A1 | * | 7/2006 | DeVries et al. | 128/204.21 |

\* cited by examiner

*Primary Examiner*—Dean A. Reichard
*Assistant Examiner*—Xiaoliang Chen
(74) *Attorney, Agent, or Firm*—Marc Bobys

(57) ABSTRACT

An electronic instrument system uses a "DualPlay" concept comprising first and second mutually-exclusive modes of operation. The system includes an instrument module having first and second communications channels, each for linking the instrument module to one or more processors. The first communications channel comprises a first connector attached to the instrument module for mating to a backplane connector electrically connected to traces. The system operates in the first mode when the instrument module communicates through the first communications channel. Additionally, the system operates in the second mode when the instrument module communicates through the second communications channel, the first connector is disengaged from the backplane connector and the electronic instrument is not communicating through the first communications channel.

24 Claims, 11 Drawing Sheets

| | Z | A | B | C | D | E | F |
|---|---|---|---|---|---|---|---|
| 11 | GND | +12V | +12V | GND | USB_D+ | USB_D- | GND |
| 10 | GND | +12V | +12V | +12V | GND | GND | GND |
| 9 | GND | +12V | +12V | +12V | GND | USB_VBUS | GND |
| 8 | GND | N/C | GND | GND | TRIG0 | N/C | GND |
| 7 | GND | N/C | GND | TRIG7 | GND | N/C | GND |
| 6 | GND | N/C | GND | GND | TRIG1 | N/C | GND |
| 5 | GND | N/C | GND | TRIG6 | GND | N/C | GND |
| 4 | GND | N/C | STAR_TRIG | GND | TRIG2 | N/C | GND |
| 3 | GND | N/C | GND | TRIG5 | GND | N/C | GND |
| 2 | GND | N/C | CLK10M | GND | TRIG3 | N/C | GND |
| 1 | GND | N/C | GND | TRIG4 | GND | N/C | GND |

ELECTRONIC INSTRUMENT SYSTEM WITH MULTIPLE-CONFIGURATION INSTRUMENT MODULES

FIELD OF THE INVENTION

The invention relates to the field of electronic test instruments.

BACKGROUND OF THE INVENTION

U.S. Pat. No. 6,823,283 to Steger, et al., describes a measurement device. The measurement device is comprised of one or more measurement modules or cards inserted into a carrier unit. The carrier unit is a "chassis" or "card carrier" such as the NATIONAL INSTRUMENTS ("NI") PXI-1031 PXI Chassis. The measurement modules are sometimes data acquisition ("DAQ") modules such as the NI PXI-4220 module, or other modules such as digitizers, digital multimeters, scopes, or arbitrary waveform generators.

The chassis can also include a NI PXI-8184 Celeron-Based Embedded Controller for controlling the measurement modules. Alternatively, an external personal computer ("PC") can be used to control the modules.

Included in the chassis is a backplane providing electrical communication with the measurement modules. The chassis can be a PXI standard chassis and the backplane can be a PXI standard trigger bus.

The problem is that the cost of the system, even without any measurement modules, is already around US$3000 (all prices are in year 2006 dollars), and after adding measurement modules can be well over US$5000.

Low cost stand-alone measurement devices are also commonly available. For example, EasySync Ltd. of Glasgow, and NATIONAL INSTRUMENTS both provide USB measurement devices, such as Oscilloscopes and DAQs for around US$200 or less. These measurement devices plug directly into a PC and are controlled using the USB standard.

Often, those with limited budgets will first purchase the less expensive stand-alone measurement devices. However, if they later need to perform more complicated DAQ, measurement, or control applications, the purchase of the stand-alone measurement devices will have been a waste and they will need to start from scratch by purchasing a new high-priced chassis and several new high-priced chassis-based measurement devices.

It would be beneficial if the same measurement modules could be used in multiple configurations in both stand-alone configurations and in chassis mounted configurations

SUMMARY OF THE INVENTION

The present invention provides test and measurement modules able to operate in "DualPlay" operation, meaning that they can be used in both a stand-alone configuration and in chassis-mounted configurations.

More particularly, an electronic instrument system has first and second mutually-exclusive modes of operation. The system includes an instrument module having first and second communications channels, each for linking the instrument module to one or more processors. The first communications channel comprises a first connector attached to the instrument module for mating to a backplane connector electrically connected to traces. The system operates in the first mode when the instrument module communicates through the first communications channel. Additionally, the system operates in the second mode when the instrument module communicates through the second communications channel, the first connector is disengaged from the backplane connector and the electronic instrument is not communicating through the first communications channel.

DETAILED DESCRIPTION

Figure 1:
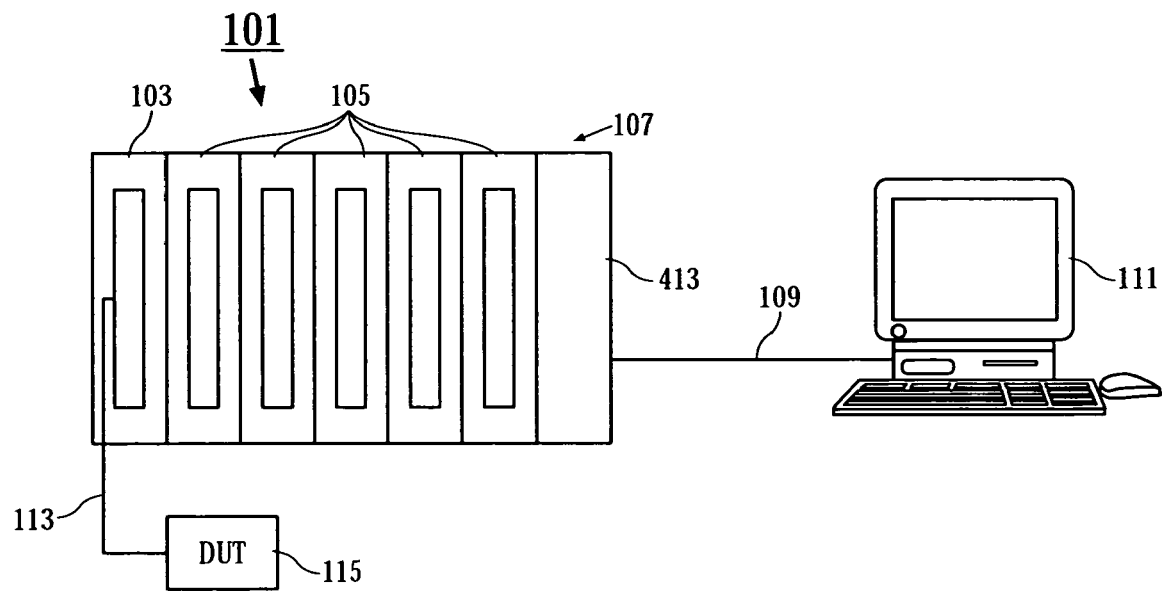
FIG. 1 is a diagrammatic depiction of an electronic instrument system configured for the first mode of operation.
Figure 2:
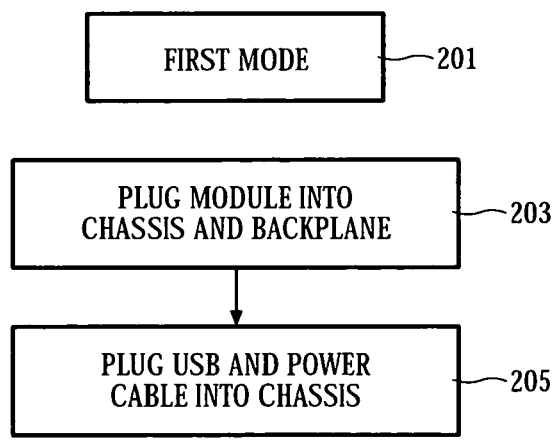
FIG. 2 is a flow chart showing the steps of a first mode of operation of the electronic instrument system of the present invention.

FIG. 2 is a flowchart showing the steps for a first mode of operation 201 of the present invention. FIG. 1 shows an electronic instrument system 101 configured for the first mode of operation 201. In the first mode of operation 201 an instrument module 103 and additional instrument modules 105 are plugged into a card-cage or chassis 107. The instrument module 103 and additional instrument modules 105 are plugged into the chassis 107 at the Step 203 of FIG. 2. A first communications channel 109 is provided for linking the instrument module 103 and additional instrument modules 105 to each other and to one or more processors, for example the PC 111. When the electronic instrument system 101 operates in the first mode it communicates through the first communications channel 109. A third communications channel 113 links the instrument module 103, or any of the additional instrument modules 105, with an external device-under-test (DUT) 115 undergoing test or measurement by the electronic instrument system 101. The third communications channel can comprise a bus, and an appropriate corresponding connector, selected from the group of, for example: USB, Ethernet, LAN, RS232, IEEE 1394, GPIB, HPIB, VXI, PCI Express, PCI, PXI, LXI, PCMCIA and other types of connectors.

Figure 3:
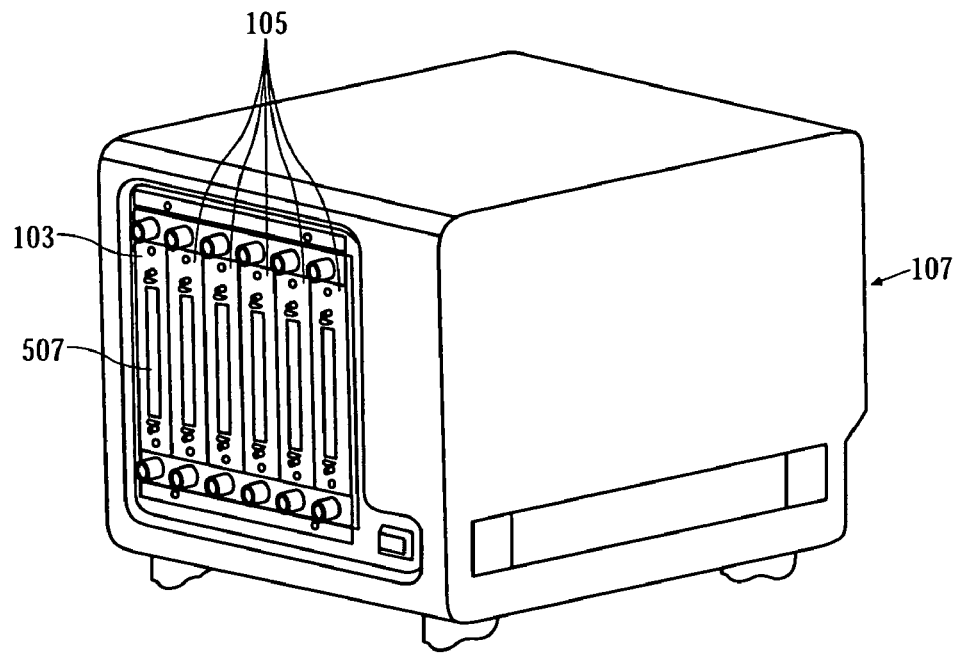
FIG. 3 is a top, right-side perspective view of a chassis with instrument modules plugged into it.

FIG. 3 shows a top, right-side perspective view of the chassis 107 with the instrument module 103 and additional instrument modules 105 plugged into it.

Industrial chassis and card cages are metal frames that support and contain electronic components and power supplies. They usually include a backplane with slots for installing expansion modules, a power supply, cooling fans, and connectors. For additional slots, an expansion chassis can be used.

Figure 4A:
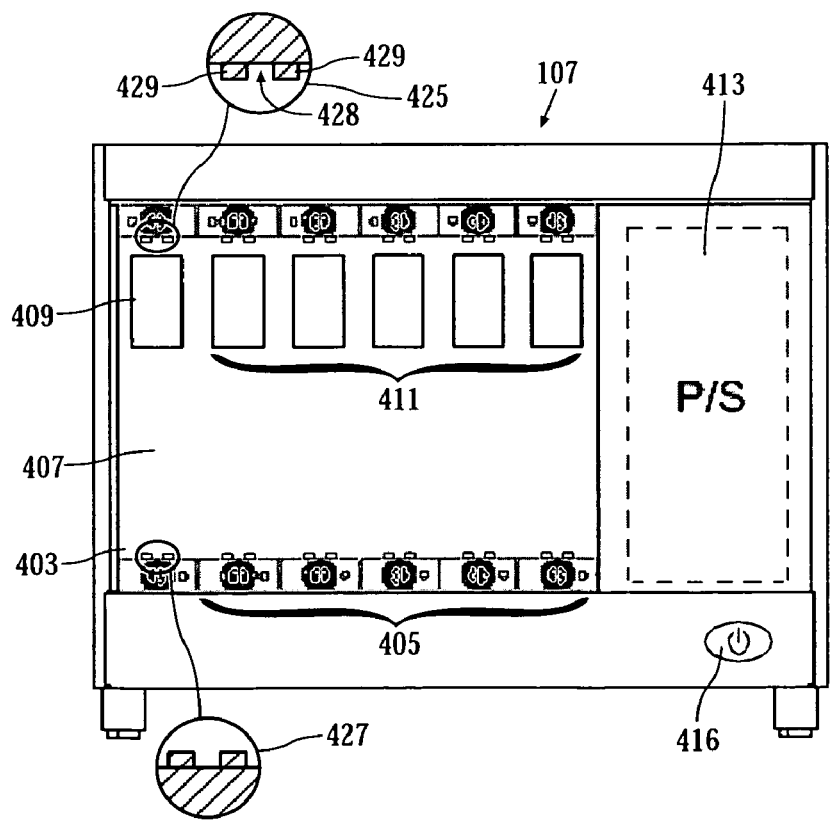
FIGS. 4a and 4b show front and back views of the chassis without the instrument modules plugged into it.
Figure 4B:
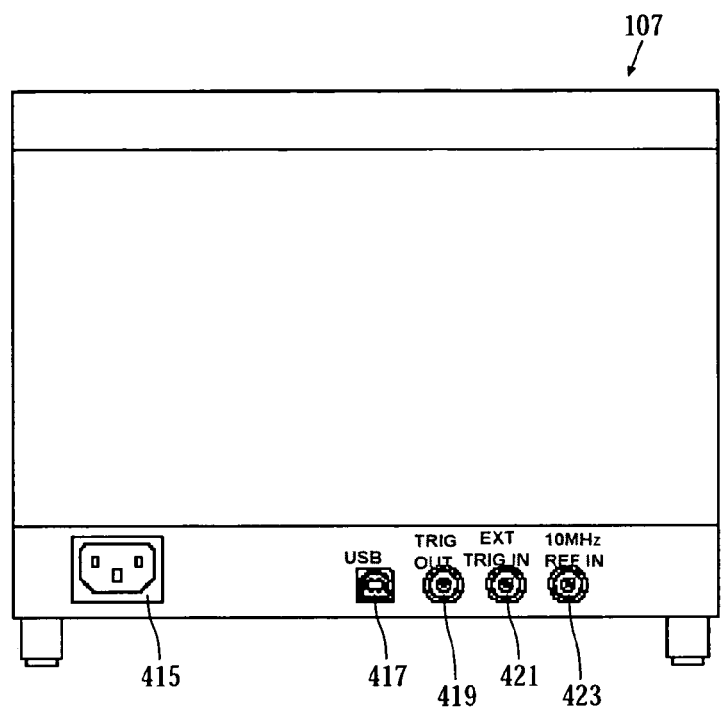

FIGS. 4a and 4b show front and back views of the chassis 107 before Step 203 of FIG. 2 has been performed to plug the instrument module 103 and additional instrument modules 105 into it. Thus the instrument modules 103, 105 are not shown in the figure. A first slot 403 and additional slots 405 are disposed to receive the instrument module 103 and additional instrument modules 105, respectively. The six slots can have 4 U height and half rack size width. At the back portion of the slots is visible a backplane 407 of the chassis 107. Attached to the backplane 407 and aligned with the first slot 403 and additional slots 405 is a first backplane connector 409 and additional backplane connectors 411. The first backplane connector 409 and additional backplane connectors 411 can be 55-Pin ERmet Male-Type C connectors. A guide-means is included at the top and bottom of the slots and along the sides of the instrument modules 103, 105 for allowing the instrument modules 103, 105 to slide into and out of the slots 403, 405. The guide means includes tracks 425, 427 at the top and bottom of the slots.

The first backplane connector 409 and additional backplane connectors 411 can be 55-pin ERmet Male-Type C connectors, for example.

Also shown as part of the chassis 107 is a power supply 413. An on/off button 416 is at the front of the chassis 107 and is used to turn the electronic instrument system 101 on and off.

Referring to FIG. 4b, a power connector 415 receives power from a power source (for example a wall outlet) for supplying power to the power supply 413 and to the instrument modules 103, 105 of FIG. 1 when they are plugged into the backplane 407 and the on/off button 416 is turned "on". At the back of the chassis 107 is also a USB connector 417, a Trigger-Out connector 419, an External Trigger In connector 421, and a Reference Clock connector 423, all of which are described in greater detail below.

Figures 6, 7:
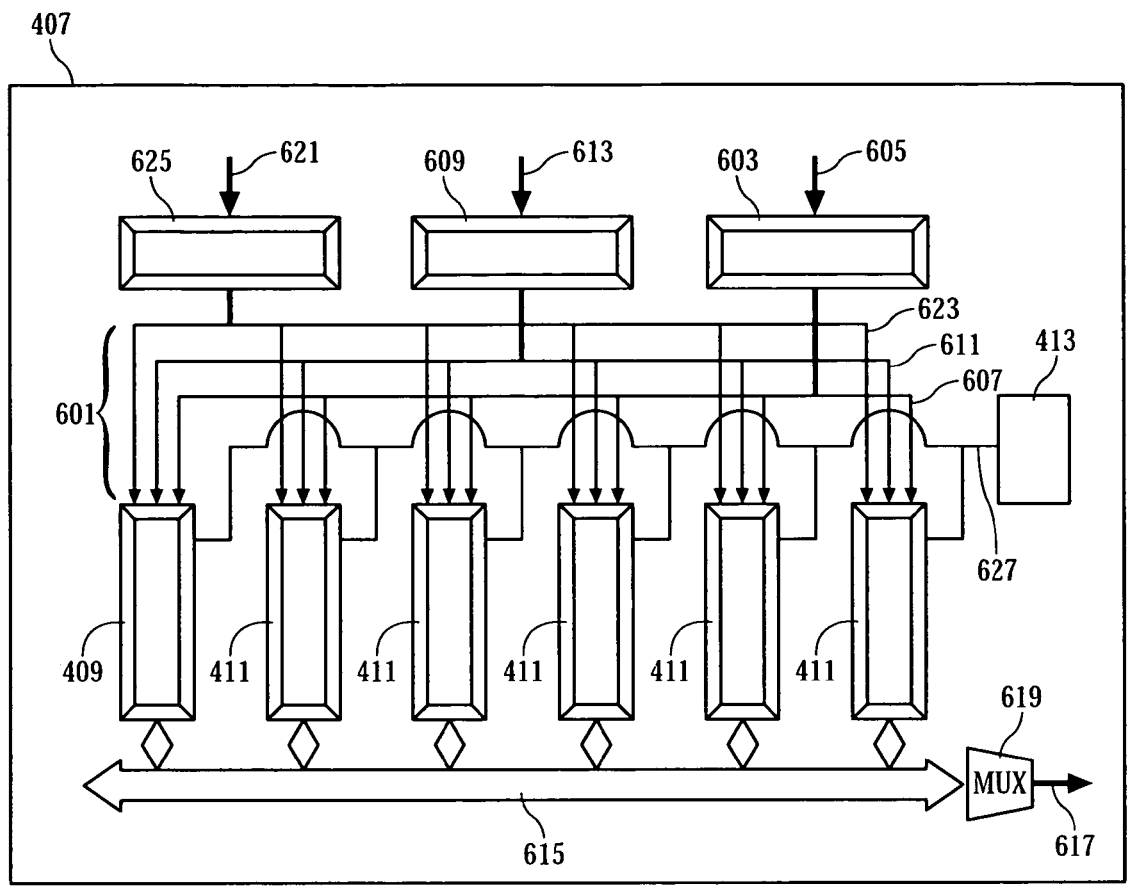
FIG. 6 shows the backplane architecture of the chassis.
FIG. 7 shows exemplary pin assignments for the backplane connectors.

FIG. 6 shows a more detailed view of the backplane 407 of the chassis 107. The configuration again is like that shown in FIG. 4a, before Step 203 of FIG. 2 has been performed to plug the instrument module 103 and additional instrument modules 105 into the backplane connectors 409, 411 of the slots 403, 405.

The backplane 407, as with other backplanes known in the art, can generally be described as the physical area where printed-circuit boards in a system plug in. It contains the buses of the system either in printed-circuit or wire-wrap form. The backplane 407 of FIG. 6 is illustrated as a printed-circuit board with traces 601 etched upon it for providing electrical connections.

In a preferred embodiment, the instrument modules and backplane use the USB communications protocol. The bus includes lines for USB communication, triggering, and clock signals. The bus also includes lines for supplying power to the instrument modules 103, 105. These lines can be implemented with the traces 601.

A USB hub 603 can be mounted in one of the slots, included in one of the instrument modules 103, 105, or incorporated into the backplane 407. The USB hub 603 can be part of the first communications channel 109 used to provide communication between each of the instrument modules 103, 105 and the processor described with reference to FIG. 1. A USB signal 605 represents the communications between the processor and the USB hub 603. The USB signal 605 is coupled to the USB hub 603 through the USB connector 417 at the back of the chassis 107 as illustrated in FIG. 4b. The USB bus uses four lines (one of which is grounded), represented by backplane communication lines 607 in FIG. 6, for transmitting USB protocol data between modules 103, 105, and between the modules and the processor.

In other embodiments, rather than using a USB bus, the bus can use the SCSI, IDE, PCI, PXI, LXI, ISA or future interface standards, for example.

An external trigger bus 609 uses backplane trigger lines 611 to synchronize the operation of the instrument module 103 and one or more of the additional instrument modules 105. The external trigger bus 609 can be a standard "star trigger bus", for example. The external trigger bus 609 receives synchronization or trigger signals 613 from an external trigger source through the Ext Trig In connector 421 at the back of the chassis 107 as illustrated in FIG. 4b. The external trigger bus 609 implements a dedicated trigger line between the external trigger input connector 421 and the slots 403, 405. Through the use of line length equalization techniques for routing the trigger signals 613, users can get very precise trigger relationships between each of the instrument modules 103, 105.

Rather than receiving the trigger signals 613 from an external source, one or more of the instrument modules inserted into the chassis 107 and backplane 407 can supply the trigger signals 613 directly to the trigger lines 611. Also, the trigger signals 613 can be generated from a source incorporated into the backplane 407.

A trigger bus 615 is used to synchronize the operation between several of the instrument modules 103, 105. Alternatively, through the trigger bus 615, one instrument module can be used to control carefully timed sequences of operations performed by the other instrument modules. Also, the instrument modules can pass the triggers to one another through the trigger bus, allowing precisely timed responses to asynchronous external events that the system is monitoring or controlling.

A Trig Out signal 617 passes from the trigger bus 615, through a multiplexer 619 and through the Trig Out connector 419 (see FIG. 4b). The Trig Out signal 617 is used to supply the trigger signal to the DUT 115 so that it can be synchronized with the instrument modules 103, 105.

A system reference clock signal 621 is provided to backplane clock lines 623 of the backplane 407. The system reference clock signal 621 can be supplied from an external source through the external clock connector 423 (see FIG. 4b where it is labelled as "10 MHz REF IN"). Alternatively, the system reference clock signal 621 can be supplied directly to the trigger lines 623 from one or more of the instrument modules inserted into the chassis 107 and backplane 407. The system reference clock signal 621 can also be supplied directly to the trigger lines 623 from a source incorporated into the backplane 407. The clock signal 621 can have a 10 MHz frequency or other frequency. The backplane 407 supplies the clock signal 621 independently to the backplane connectors 409, 411. An independent buffer comprised of buffer circuitry 625, which provides a source impedance matched to the backplane and a skew of less than 1 ns between the slots, drives the clock signal 621 to each of the connectors 409, 411 in the slots 403, 405. The common clock signal 621 can be used to synchronize multiple modules in a measurement or control system.

In the first mode 201, when the instrument module 103 and additional instrument modules 105 are electrically connected to the backplane 407, the modules receive power through the backplane connectors 409, 411 of the backplane 407. Power is transmitted from the power supply 413 to the backplane connectors 409, 411 along a power bus 627 traced onto the backplane 407. The power bus 627 can include 8 separate +12V traces 601 for better current handling characteristics.

The power supply 413 is illustrated in FIGS. 1, 4a and 6. The power supply can be part of the chassis 107, attached to the backplane 407, or can be part of one of the instrument modules 103, 105, for example. In FIGS. 1 and 4a, the power supply 413 is illustrated as part of the chassis 107. In FIG. 6 the power supply 413 is illustrated as part of the backplane 407. The power supply 413 receives power through the power connector 415 illustrated in FIG. 4b. The AC power supplied to the power connector 415 can come from a power line connected to a wall outlet, for example.

FIG. 7 shows exemplary pin assignments for the first backplane connector 409 and additional backplane connectors 411. In this example, there are four USB pin connections (one of which is grounded) electrically connected to the four backplane communication lines 607 used for transmitting USB protocol data between instrument modules, and between modules and the processor.

Also included are trigger pin assignments (listed as TRIG0-TRIG7 in the figure) and an additional "star trigger" line (labeled STAR_TRIG) for supplying the trigger signals.

There are eight separate +12V pin connections for supplying power to the instrument modules through the power bus 627.

Figure 5A:
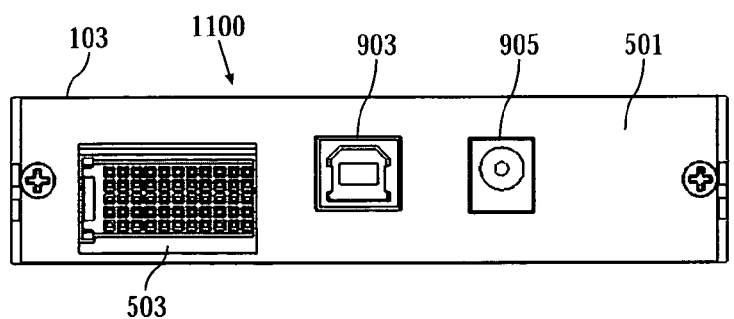
FIG. 5a shows a view of a back face of the instrument module.

FIG. 5a shows a view of a instrument module back face 501 of the instrument module 103. The additional instrument modules 105 can have the same back-face configuration and pin assignments as the instrument module 103. The instrument module back face 501 includes a first connector 503 for mating to any of the backplane connectors 409, 411 of the backplane 407. The first connector 503 can be a 55-hole ERmet Female-Type C connector. The pin assignments for the first connector 503 are the mirror image of those of the backplane connector 409 illustrated in FIG. 7.

Figure 5B:
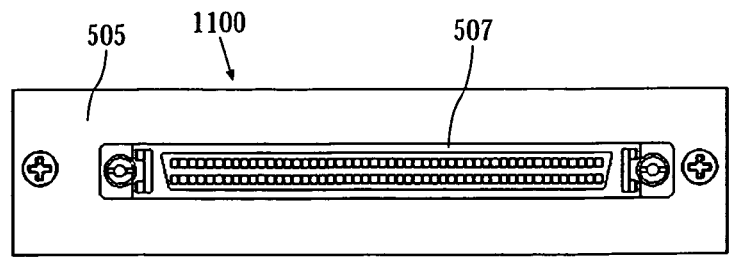
FIG. 5b shows one embodiment of a front face of the instrument module.

FIG. 5b shows one embodiment of a front face 505 of the instrument module 103. The additional instrument modules 105 can have this same front-face configuration. The front faces of the instrument modules 103, 105 are also visible in FIG. 3 wherein the instrument modules 103, 105 are inserted into the chassis 107. A third connector 507 is attached to the front face 501 of the instrument module 103. The third connector 507 can be any type of connector appropriate for use in the third communications channel 113 for connecting to the DUT 115 (FIG. 1). Examples of appropriate connectors can be USB, LAN, RS232, GPIB, HPIB, LXI, etc. An RF transceiver can also serve as the third connector 507. The instrument module 103 can have more than one connector attached to the front face 501 and can have more than one communications channel for connecting to the DUT 115. Also, each of the instrument modules 103, 105 can have a different type of connector attached to the front face 501 for connecting to DUTs. Some types of instrument modules might also not need to communicate with DUTs at all and in such a case there might be no third connector 507 or third communications channel 113 for the particular instrument module.

A USB cable and a power cable are plugged into the USB connector 417 and power connector 415, respectively, of FIG. 4b at Step 205 of FIG. 2.

As described above with respect to FIG. 1, when the electronic instrument system 101 operates in the first mode 201, communications between the instrument module 103, additional instrument modules 105, and one or more processors is through the first USB communications channel 109. Portions of the connections forming the communications channel 109 in one embodiment are now described in more detail for operating in the first mode 201. The first connector 503 (FIG. 5a) is mated to any of the backplane connectors 409, 411 of the backplane 407 (FIGS. 4a and 6). The backplane connectors 409, 411 are electrically connected to the four backplane communication lines 607. The USB hub 603, which alternatively can be a communications hub for a protocol other than USB, is electrically connected to all of the backplane connectors 409, 411 through the backplane communication lines 607. The USB hub 603 is electrically connected to the processor, for example the PC 111 (FIG. 1), through the USB connector 417 (FIG. 4b), and a USB cable (not shown). Thus the signal 605 (FIG. 6) can travel between any of the modules 103, 105 (communications between modules) and between any of the modules and the PC 111.

Rather than using the USB protocol for communications, other protocols, including other busses and connectors can be used, such as wireless USB, LAN, Ethernet, RS232, IEEE 1394, GPIB, HPIB, PCMCIA, LXI, etc.

Rather than implementing the one or more processors in the PC 111, the one or more processors can be on the backplane 407, or can be included in one or more of the instrument modules 103, 105. In these alternative embodiments, the first communications channel 109 communicates with the processor directly through the backplane rather than through the USB connector 417 (FIG. 4b) and the USB cable.

Figure 8:
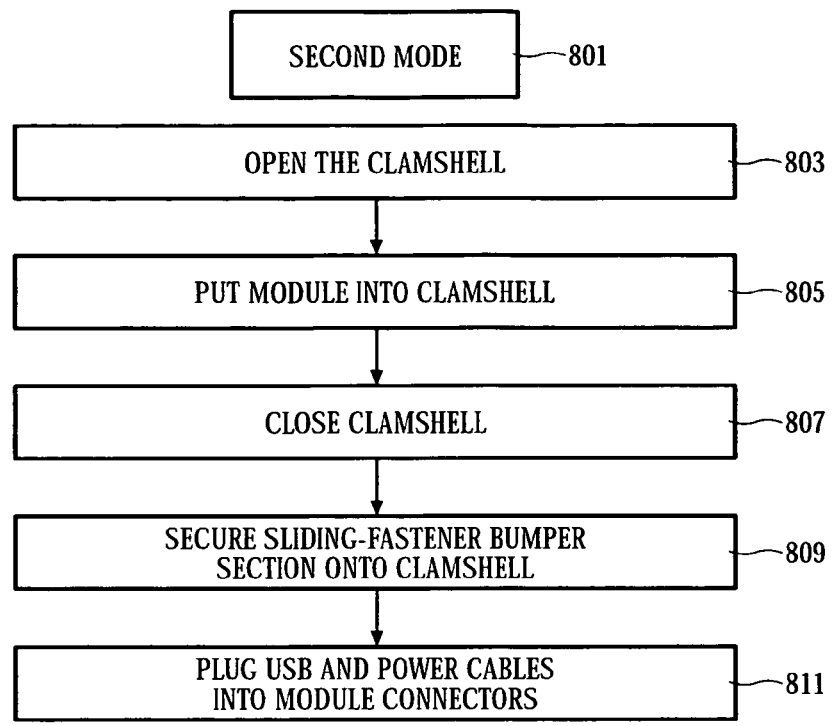
FIG. 8 is a flowchart showing the steps of a second mode of operation of the electronic instrument system of the present invention.

FIG. 8 is a flowchart showing the steps for a second mode of operation 801 of the present invention.

Figure 9A:
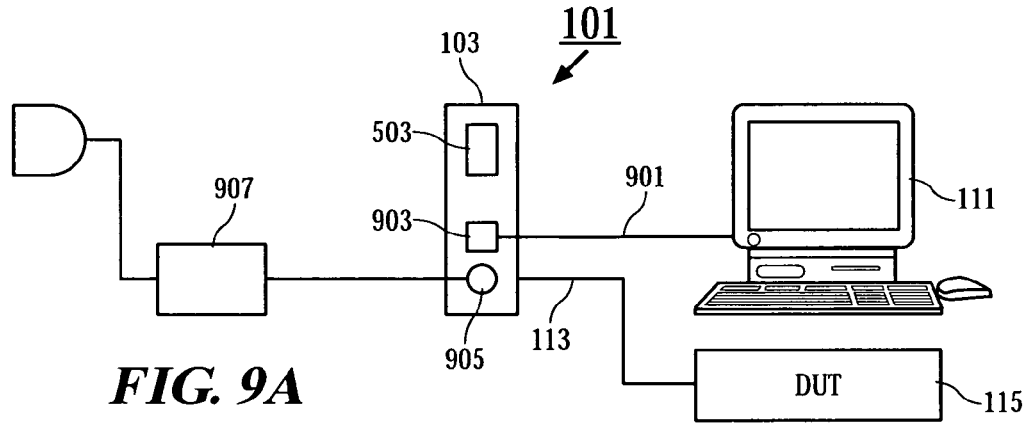
FIGS. 9a and 9b show the electronic instrument system configured for the second mode of operation.
Figure 9B:
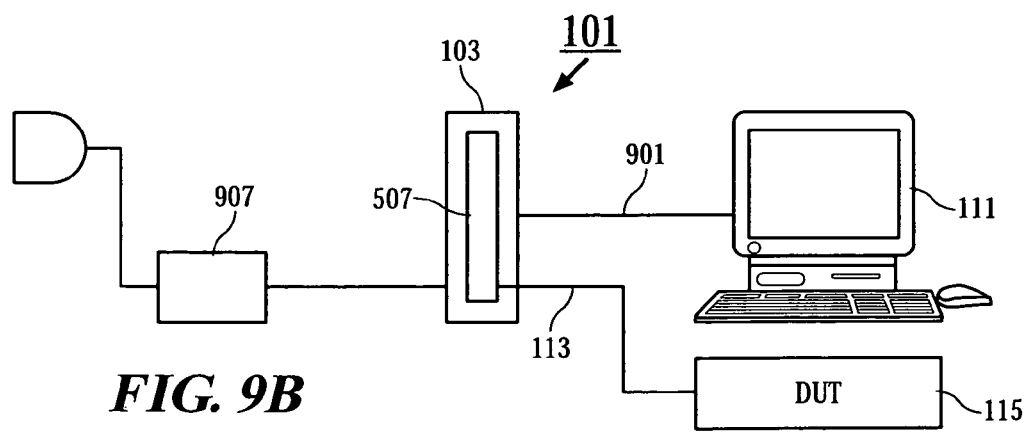

FIGS. 9a and 9b show the electronic instrument system 101 configured for the second mode of operation 801. The instrument modules 103, 105 can interact with the DUT 115 in a "stand alone" state, without being plugged into the chassis 107 when operating in the second mode of operation 801.

A second communications channel 901 links the instrument module 103 to one or more processors, for example the PC 111. When the electronic instrument system 101 operates in the second mode of operation 801, the instrument module 103 communicates through the second communications channel 901. This second mode 801 can be used and the instrument module 103 can communicate through the second communications channel 901 when the instrument module 103 is not inserted into any of the slots 403, 405, so that the first connector 503 is not mated to any of the backplane connectors 409, 411. When operating in the second mode of operation 801, the electronic instrument system 101 does not communicate through the first communications channel 109.

The second communications channel 901 can be formed using any of the technologies described with respect to communications link of the communications channel 109 for linking the instrument modules 103, 105 to the processor described above. For example, the link can be made by USB, wireless USB, LAN, Ethernet, RS232, IEEE 1394, GPIB, HPIB, PCMCIA, etc.

In one embodiment, the instrument module 103 includes a second connector 903 which, for example, can be a standard USB-type connector (see also FIG. 5*a*). In other embodiments the connector can be wireless, LAN, Ethernet, RS232, IEEE 1394, GPIB, HPIB, PCMCIA, LXI, etc. The connector 903 is attached to a cable which connects to a similar connector or connectors attached to the one or more processors, such as the PC 111. Thus, the second communications channel 901 can include the second connector 903, the cable and the connector attached to the processor. In the case of the USB connector, the second communications channel 901 might use a USB protocol for the communications with the one or more processors.

Also shown in FIG. 9*b* is the third communications channel 113 which outputs signals from the third connector 507 of the instrument module 103, or any of the additional instrument modules 105, to the external device-under-test (DUT) 115 undergoing test or measurement by the electronic instrument system 101.

In another embodiment, the instrument module 103 includes a wireless transceiver for forming the second communications channel and providing communications between the instrument module and one of the one or more processors using a second wireless transceiver electrically connected to the one or more processors.

Power can be supplied to the instrument module 103 through a module power connector 905 (see FIGS. 5*a* and 9*a*) into which an AC/DC converter 907 can be plugged. The AC/DC converter can also be used to supply power to the chassis 107 in FIG. 4*b*.

Figure 10:
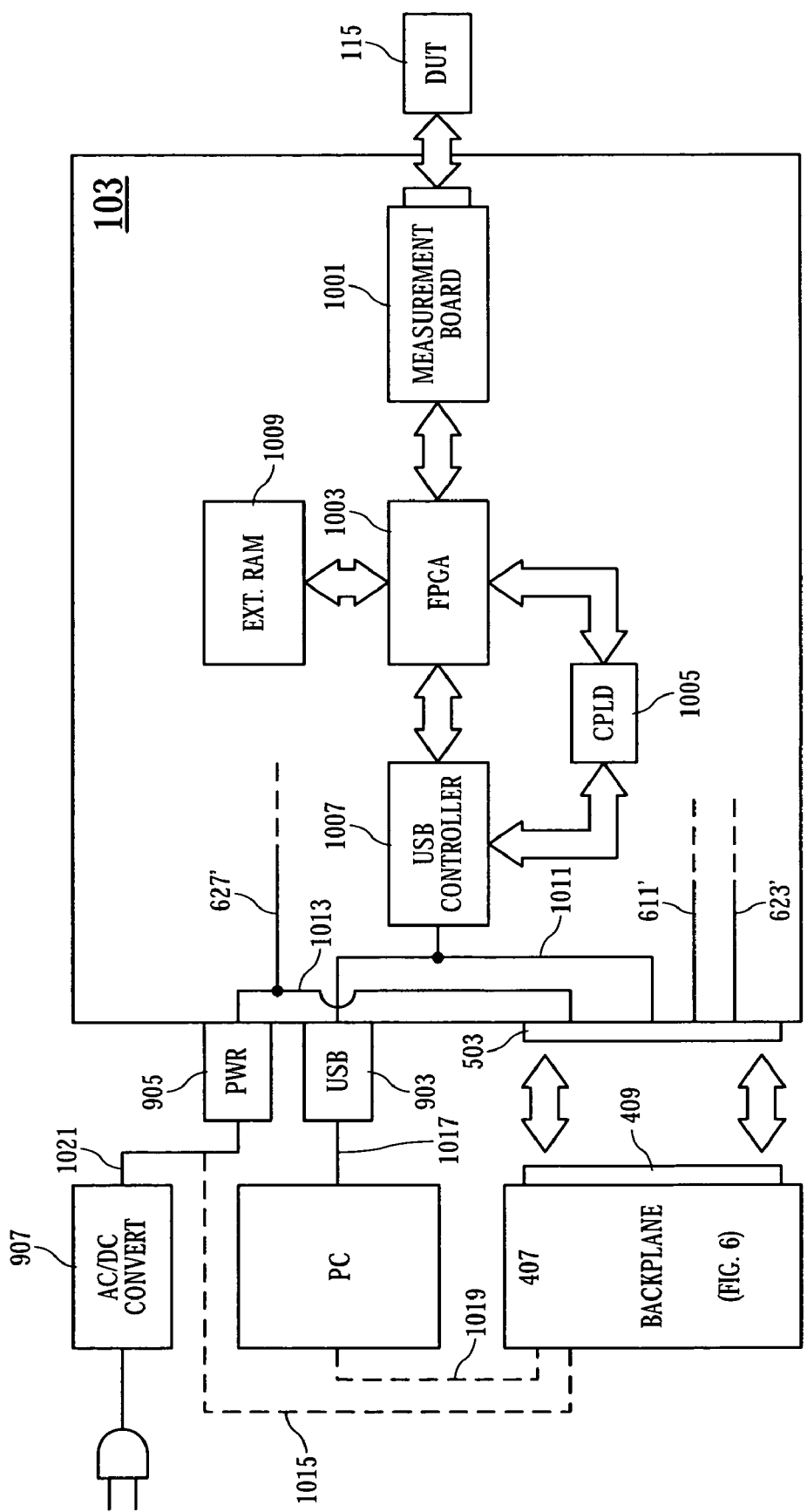
FIG. 10 shows a electrical block diagram of the instrument module.

FIG. 10 shows a general schematic diagram of the instrument module 103, or the additional instrument modules 105, in more detail. This general block diagram can represent the instrument module 103 or any of the additional instrument modules 105. The components of the instrument module 103 can be mounted on a printed circuit board ("PCB"). The particular function of the instrument module 103 depends on a measurement board section 1001. For example, the measurement board section 1001 can provide the instrument module 103 with the function of a DAQ, scope, function generator, source or controller, for example. In both the first mode of operation 201 and the second mode of operation 801 the instrument module 103 with the measurement board 1001 can send signals to or receive signals from the DUT 115 as described above with respect to FIGS. 5*b* and 9*b*. Thus, the instrument module 103, or any of the additional instrument modules 105, can comprise a third communications channel 113 which links the instrument module 103, or any of the additional instrument modules 105, with the external DUT 115 undergoing test or measurement by the electronic instrument system 101. The third communications channel can comprise a bus using a standard such as USB, Ethernet, LAN, RS232, IEEE 1394, GPIB, HPIB, VXI, PCI Express, PCI, PXI, LXI, PCMCIA, or other bus standards.

While each measurement board 1001 can be designed for a specific application, the instrument module 103 and additional instrument modules 105 will also have other electrical blocks in common with each other to allow it to work in both the first and second modes of operation. For example, measurement boards 1001 of various functions can provide data to and receive instructions from the processor, for example the PC 111, utilizing the blocks: FPGA (Field Programmable Gate Array) 1003, CPLD (Complex Programmable Logic Device) 1005, USB Controller 1007 and External RAM 1009.

FIG. 10 further shows details of the connections allowing the instrument module 103 to be used in both the first mode of operation 201 and the second mode of operation 801.

In the first mode of operation 201, the first connector 503 of the instrument module 103 is mated to one of the backplane connectors 409, 411 of the backplane 407. The USB signals 605 from the processor, in particular from the PC 111, are linked to the USB controller 1007 through a USB cable 1019, the USB connector 417, the USB hub 603, the four backplane communication lines 607, the backplane connectors 409, 411, the first connector 503 and instrument module communication lines 1011. The instrument module communication lines 1011 typically include four separate lines for USB protocol communications.

In the second mode of operation 801, the instrument module 103 is not plugged into the chassis 107. The USB signals 605 from the processor, in particular from the PC 111, are linked to the USB controller 1007 through a USB cable 1017, the second connector 903, which can be a standard USB-type connector, and the instrument module communication lines 1011. Additionally, the second connector 903 can be Ethernet, LAN, RS232, IEEE 1394, GPIB, HPIB, VXI, PCI Express, PCI, PXI, LXI, PCMCIA or other type of connector.

In one embodiment, all four of the instrument module communication lines 1011 are always connected to both the first connector 503 and the USB connector 903. Because the electronic instrument system 101 has first and second mutually-exclusive modes of operation, the instrument module 103 will only receive the USB signals 605 through either the USB connector 903 or the first connector 503 at a given time.

In the first mode of operation 201, the instrument module 103 receives power through the AC/DC converter 907, power cable 1015, power connector 415, power supply 413, power bus 627, backplane connectors 409 or 411, pins of the first connector 503, through instrument module power lines 1013 to instrument module traces 627' for supply to the individual blocks 1001, 1003, 1005, 1007, 1009 of the instrument module 103. The instrument module power lines 1013 and instrument module traces 627' can include 8 separate +12V lines for better current handling characteristics.

In the second mode of operation 801, the instrument module 103 again receives power through the AC/DC converter 907, but instead of through the power cable 1015 and the chassis 107 as in the first mode of operation 201, in the second mode the instrument module 103 receives the power through the power cable 1021 directly into the module power connector 905 and instrument module power lines 1013 to instrument module traces 627' for supply to the individual blocks 1001, 1003, 1005, 1007, 1009 of the instrument module 103.

In one embodiment, the instrument module power lines 1013 are always connected to both the module power connector 905 and the pins of the first connector 503. Because the electronic instrument system 101 has first and second mutually-exclusive modes of operation, the instrument module 103 will only receive power from the module power connector 905 or the pins of the first connector 503 at a given time.

FIG. 10 also shows instrument module trigger lines 611' and instrument module clock lines 623'. The instrument module trigger lines 611' receive the signals from the backplane trigger lines 611 directly through the first connector 503. The instrument module clock lines 623' receive the signals from the backplane clock lines 623 directly through the first connector 503.

Thus, in the embodiment of FIG. 10, when the system is operating in the first mode 201 the modules will receive trigger/clock signals into 611' and 623', while in the second mode 801 they will not. In the second mode, there will typically be no synchronization between instrument modules when any of the instrument modules 103, 105 are used together. With the standard USB framework there is no ability to provide synchronous real-time control or data acquisition for applications including test, measurement, control and automation. However, on-board clocks can be added to the instrument modules 103, 105 to allow synchronization between them using systems such as IEEE 1588 protocol or by using "USB-inSync" from Fiberbyte in Adelaide, Australia.

Figure 11A:
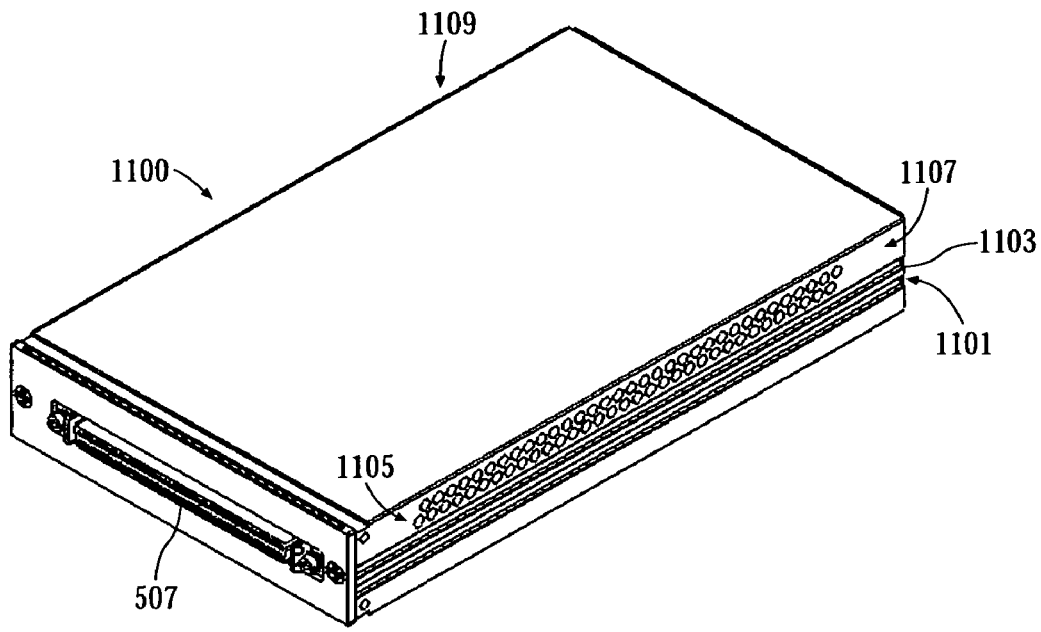
FIG. 11a is a top, right-side perspective view of a protective instrument module casing enclosing the instrument module.
Figure 11B:
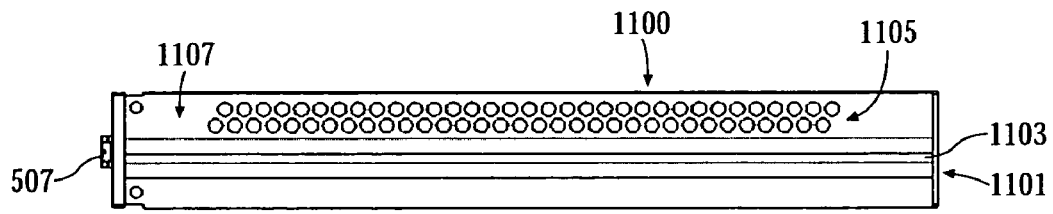
FIG. 11b is a view of the right-side of the instrument module casing.

FIG. 11a shows a top, right-side perspective view of a protective instrument module casing 1100 enclosing the first instrument module 103 and additional instrument modules 105. FIG. 11b shows a view of the right-side of the instrument module casing 1100.

The protective instrument module casing 1100 can have a length of approximately 174.34 mm, a width of 105.00 mm and a height of 25.00 mm. In other embodiments the height can have a dimension of 20.00 mm or 30.00 mm.

The protective instrument module casing 1100 has substantially identical side faces 1107, 1109. It is important to enclose the instrument modules 103, 105 in the protective casing to protect the PCB and blocks illustrated in FIG. 10 from damage that can occur while inserting and removing the instrument modules from the chassis 107 or otherwise moving the instrument modules between the first mode and second mode of operation. FIGS. 5a and 5b, described above, show the back and front views of the instrument module casing 1100, respectively.

The protective instrument module casing 1100 and chassis include a guide-means at the top and bottom of the slots 403, 405 and along the side faces 1107, 1109 of the instrument modules 103, 105 for allowing the instrument modules 103, 105 to slide into and out of the slots 403, 405. As illustrated in FIGS. 4a, 11a and 11b, the guide means includes tracks 425, 427 at the top and bottom of the slots for mating with tracks 1101 on the sides 1107, 1109 of the protective casing 1100. The tracks 425, 427 include a groove 428 between two runners 429. The tracks 1101 includes a runner 1103, the runner 1103 fitting into the groove 428 for constraining the motion of the instrument module to slide substantially along the direction of the grooves and runners when inserted or removed from a slot of the chassis.

As shown in FIG. 11a, the protective instrument module casing 1100 also includes ventilation holes 1105 along its side faces. The chassis 107 of FIG. 4a can include a cooling fan either above or below the slots for blowing air through the ventilation holes 1105 passing through each of the faces 1107, 1109. The chassis 107 can also include holes at the top and bottom to allow ambient air outside the chassis to be pulled by the cooling fan into the chassis, through the instrument module 103 via the ventilation holes 1105, to transport heat from inside the instrument module 103 to outside the chassis 107.

Figure 12:
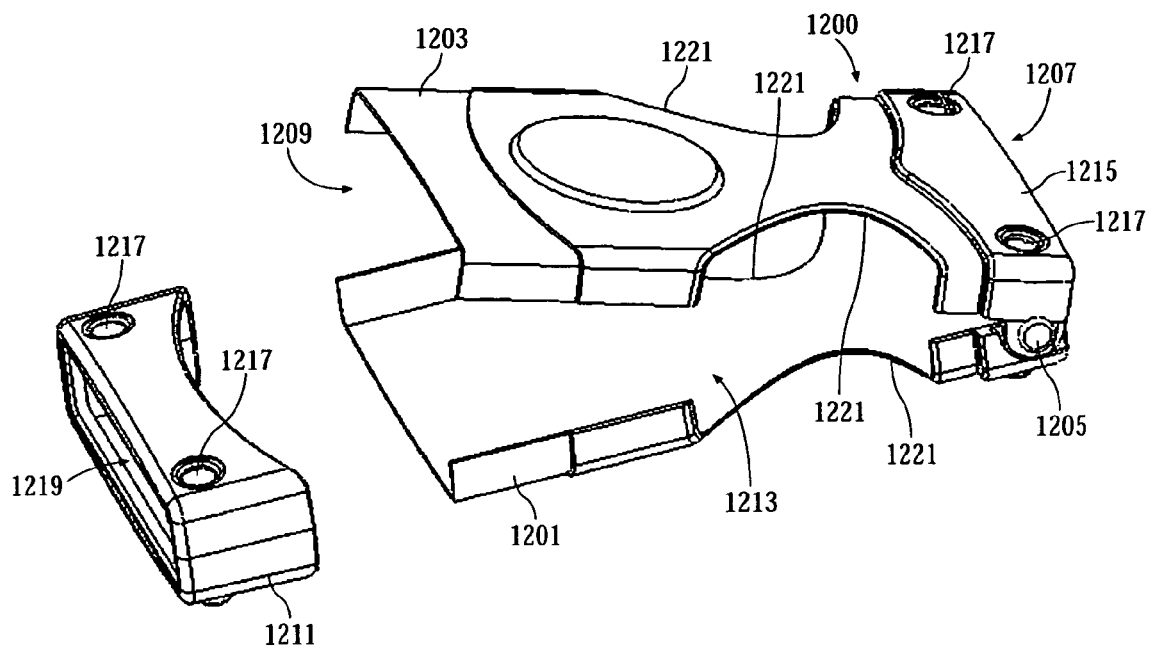
FIG. 12 shows a clamshell housing for holding the instrument module.
Figure 13A:
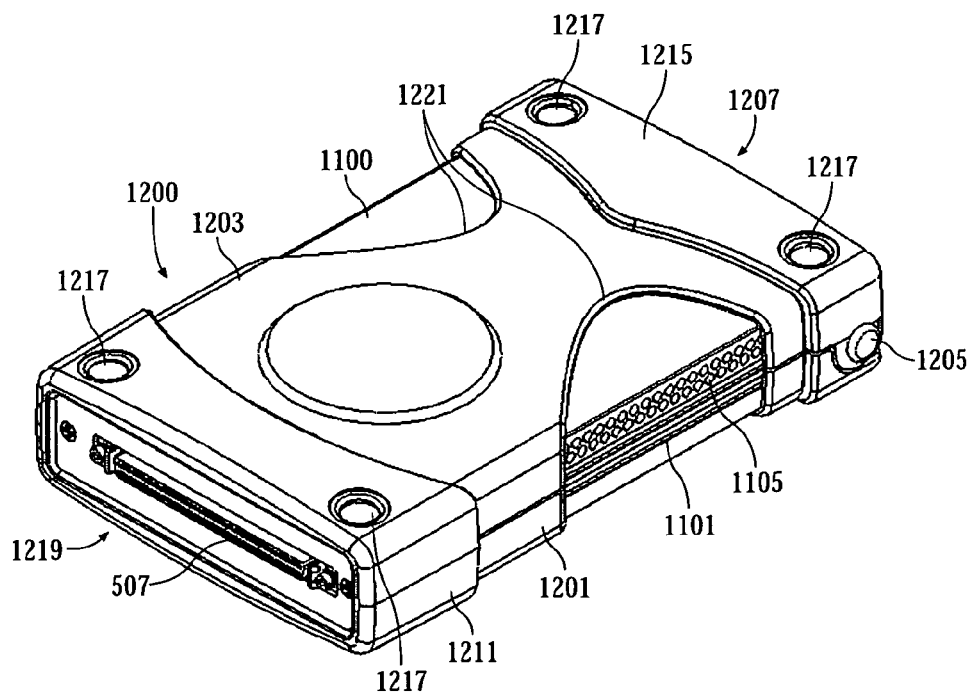
FIG. 13a is a top, right-side perspective view of the housing with the instrument module enclosed within.
Figure 13B:
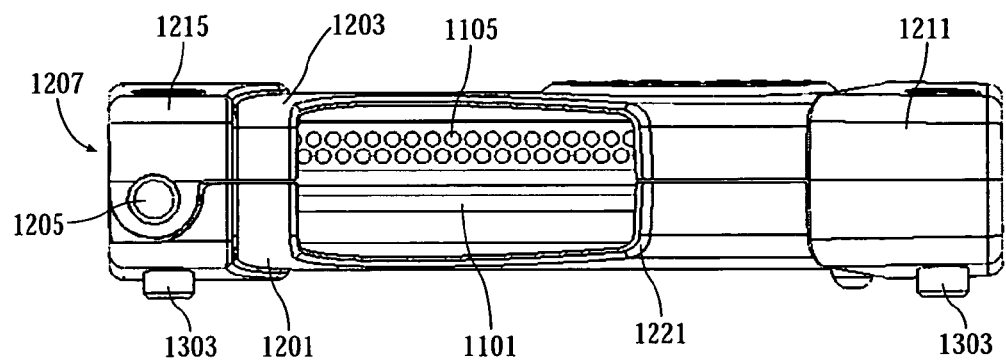
FIG. 13b is a left-side elevational view of the housing with the instrument module enclosed within.
Figure 13C:
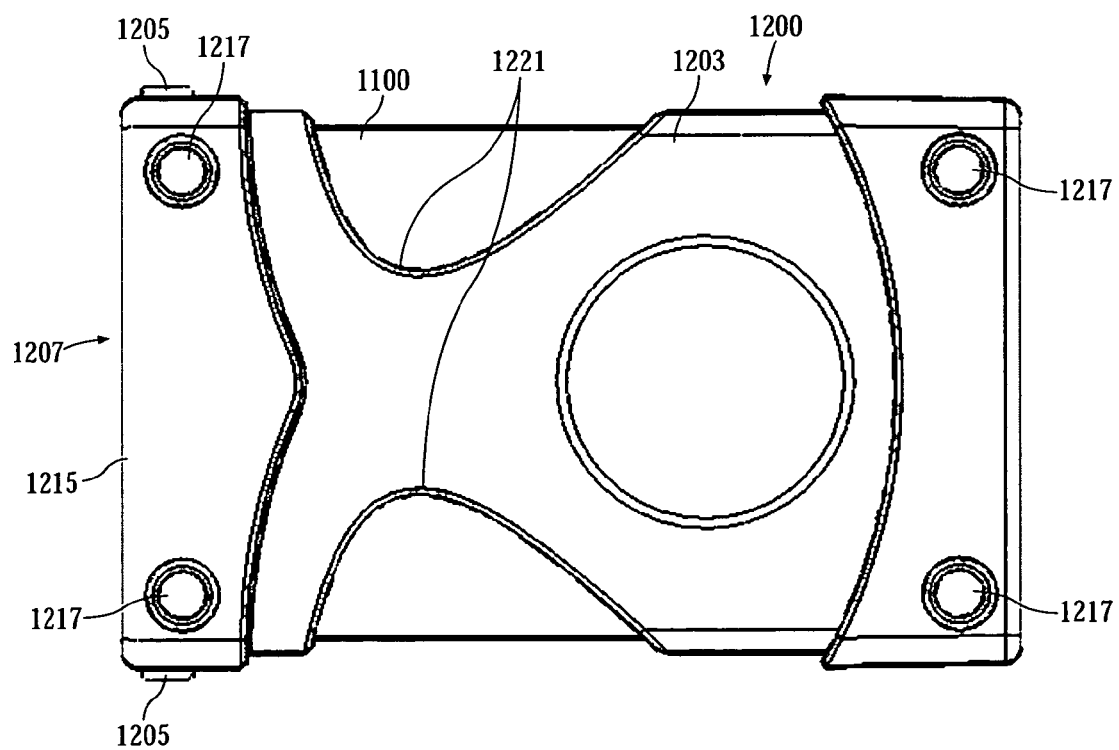
FIG. 13c is a top plan-view of the housing with the instrument module enclosed within.
Figure 13D:
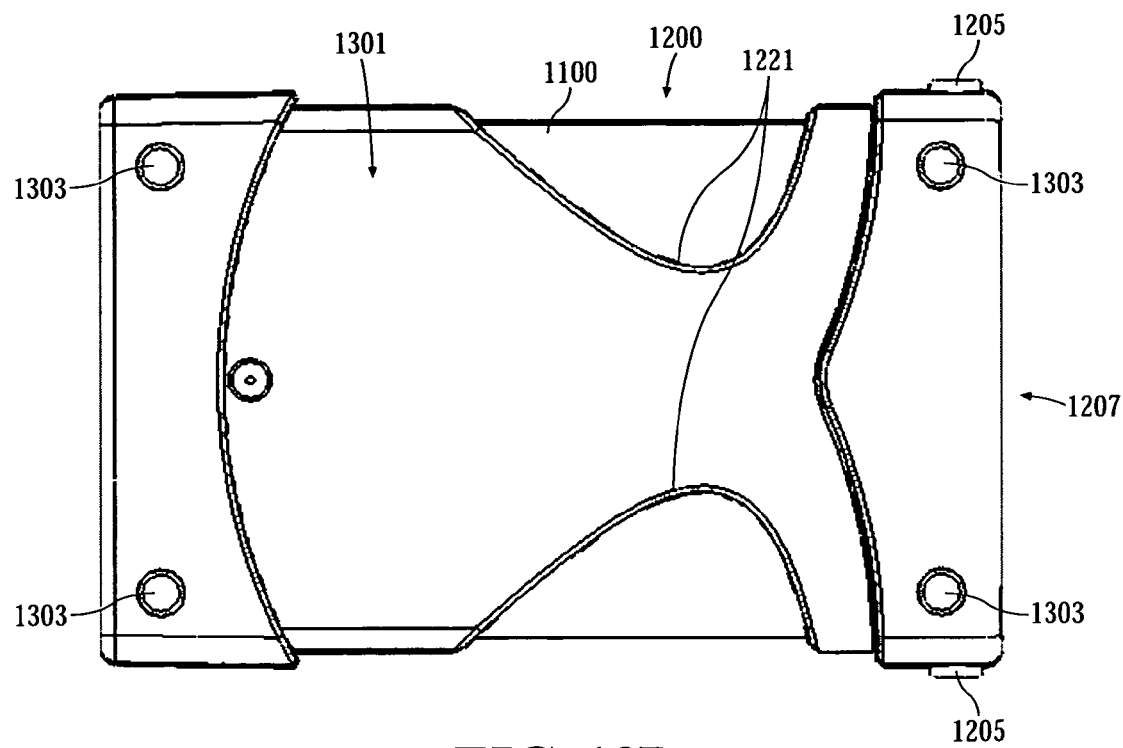
FIG. 13d is a bottom plan-view of the housing with the instrument module enclosed within.
Figure 13E:
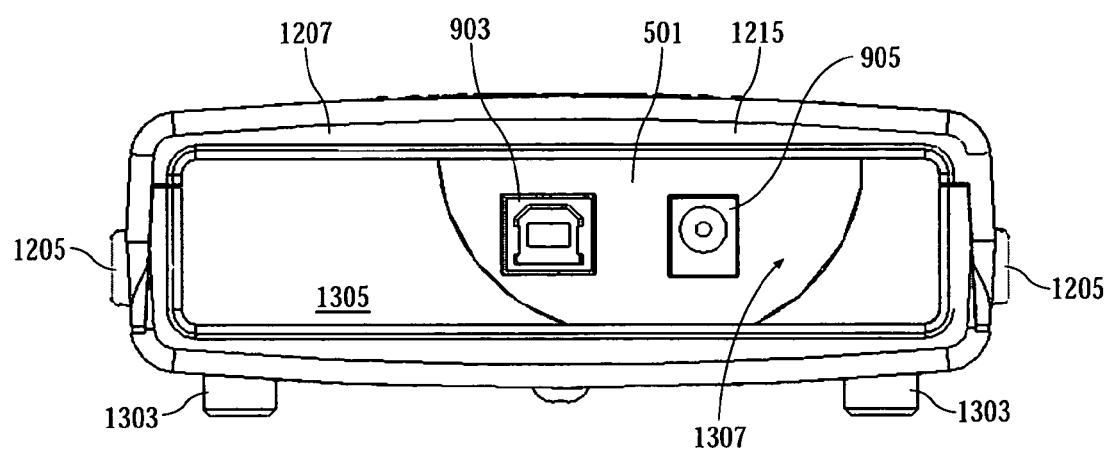
FIG. 13e is a rear elevational view of the housing with the instrument module enclosed within.

FIG. 12 shows a clamshell housing 1200 for the instrument module 103. FIG. 13a is a top, right-side perspective view of the housing 1200 with the module 103 enclosed within. FIG. 13b is a left-side elevational view of the housing 1200 with the module 103 enclosed within. FIG. 13c is a top plan-view of the housing 1200 with the module 103 enclosed within. FIG. 13d is a bottom plan-view of the housing 1200 with the module 103 enclosed within. FIG. 13e is a rear elevational view of the housing 1200 with the module 103 enclosed within.

The clamshell housing 1200 protects the instrument module 103 when it is used in the second mode of operation 801. A first shell section 1201 and a second shell section 1203 are pivotally connected by a hinge mechanism 1205 at a hinge end 1207 of the housing 1200 that allows rotation of the first and second sections 1201, 1203 relative to one other between an open and closed position. Opposite the hinge end 1207 of the housing 1200 is an open end 1209. A sliding-fastener bumper section 1211 slides over the open end 1209 and secures the housing 1200 in the closed position. A main storage compartment 1213 is formed by the first and second shell sections 1201, 1203 when in the closed position for holding the instrument module 103. A hinge bumper-section 1215 is at the hinge end 1207 of the housing 1200. At both the top and bottom of the housing 1200 are securing sections for securing multiple instrument module clamshell housings in a vertical stacked configuration.

The sliding-fastener bumper section 1211 and hinge bumper-section 1215 can be rubber and provide additional protection to the instrument module 103 from vibration and dropping when operating in the second mode of operation 801.

Figure 14:
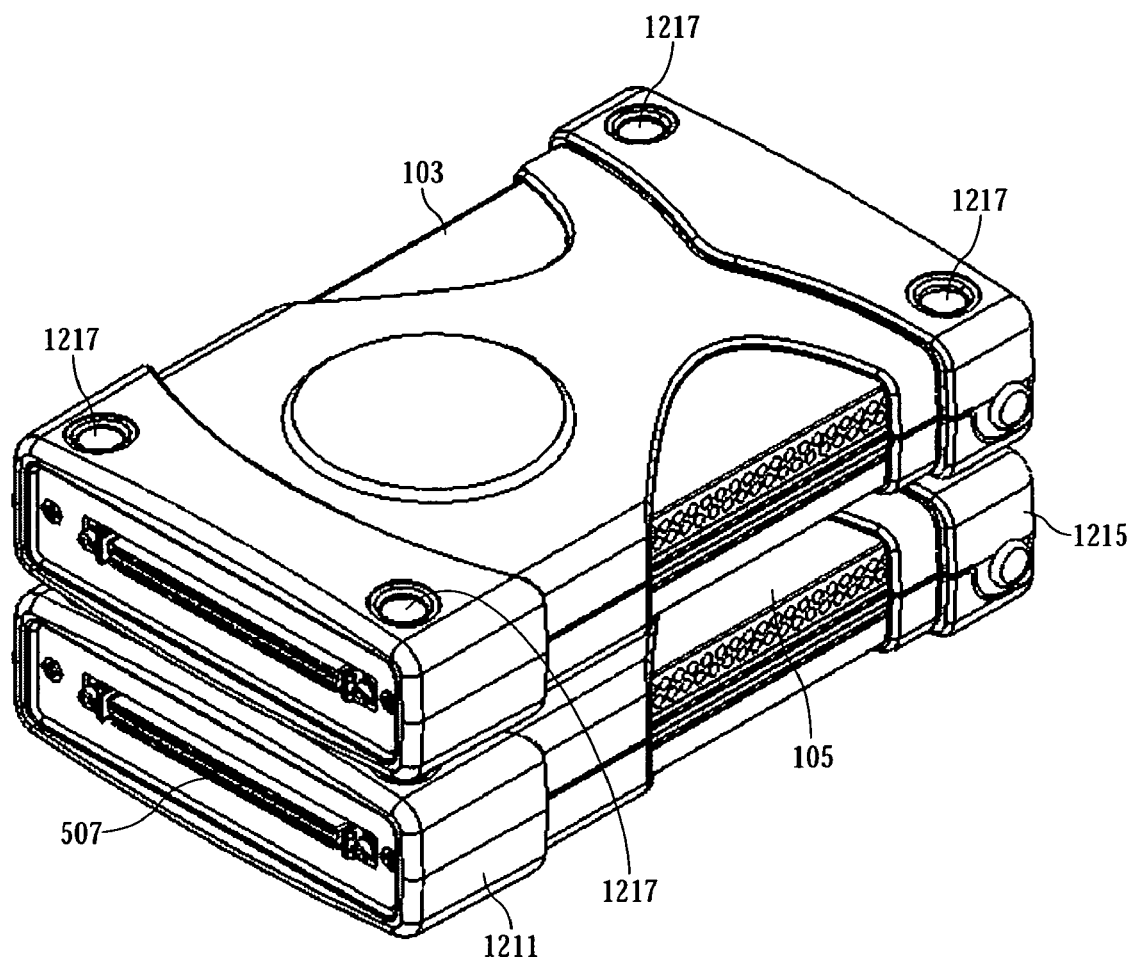
FIG. 14 shows two instrument modules, each enclosed in a housing and stacked in a vertical stacked configuration.

FIG. 14A shows two modules, for example the instrument module 103 and one of the additional instrument modules 105, each enclosed in a housing 1200 and stacked in a vertical stacked configuration. More than two modules can also be stacked. Test benches are often small and cluttered with equipment. Available working space is often very limited. By allowing the instrument modules 103 and additional instrument modules 105 to be stacked vertically, many instrument modules can be available while only occupying the footprint of a single clamshell housing 1200 on the surface of the test bench.

The securing sections can comprise protrusions or legs 1303 at the bottom of the hinge bumper-section 1215 and sliding-fastener bumper section 1211 and indentations or cavities 1217 at the top of the hinge bumper-section 1215 and sliding-fastener bumper section 1211. Two or more instrument modules 103, each enclosed in a housing 1200 and stacked with each of the legs 1303 fitted into one of the cavities 1217 to prevent an instrument module 103 stacked on top of another instrument module from sliding off the vertical stack. The legs 1303 can be made from rubber to provide stability to the instrument module when placed on a table or when stacked on other clamshell housings 1200.

As shown in FIGS. 12 and 13a, the front face of the sliding-fastener bumper section 1211 has an opening 1219 formed therein to allow access to the third connector 507 of the held instrument module 103.

As shown in FIG. 13e, at the hinge end 1207 of the housing 1200 is a housing back face 1305 of the hinge bumper-section 1215. The housing back face 1305 has hinge bumper opening 1307 formed therein to allow access to the second connector 903 and the module power connector 905 on the instrument module back face 501. The housing back face 1305 covers the first connector 503 of the held instrument module. By covering the first connector 503, the connector is protected from accidental impacts when operating in the second mode of operation 801. Also, by covering the first connector 503 a user is prevented from improperly trying to plug a cable into the first connector 503 when intending to operate in the second mode of operation 801.

The first connector 503 is only meant to be used during the first mode of operation 201. This prevents communication signals or power from entering the lines 1011, 1013 of FIG. 10 from two different sets of connectors at the same time.

As shown in FIGS. 12 and 13b, housing side portion ventilation opening 1221 are formed in the first and second sections 1201, 1203 of the housing 1200. The ventilation opening 1221 align with the ventilation holes 1105 of the protective instrument module casing 1100 to allow air-flow between the ambient air and the inside of the instrument module 103. A cooling fan can also be placed outside of the housing 1200 to force air through the ventilation openings 1221 and ventilation holes 1105.

When setting up the instrument module and additional instrument modules to operate in the second mode of operation the following steps shown in FIG. 8 can be performed:

STEP 803: open the clamshell housing 1200.

STEP 805: put the instrument module 103 into the clamshell housing 1200.

STEP 807: close the clamshell housing 1200.

STEP 809: secure the sliding-fastener bumper section 1211 onto the clamshell housing 1200.

STEP 811: plug the USB cable 1017 into the second connector. 903 of the instrument module 103 and plug the power cable 1021 into the module power connector 905.

Significantly, the clamshell housing 1200 requires no screws or screw-driver for assembling to enclose the instrument module 103.

In the foregoing specification, the invention has been described with reference to specific exemplary embodiments thereof. The specification and drawings are, accordingly, to be regarded in an illustrative sense rather than a restrictive sense.

The invention claimed is:

1. An electronic instrument system having first and second mutually-exclusive modes of operation comprising:
an instrument module having first and second communications channels, each for linking the instrument module to one or more processors;
wherein the first communications channel comprises a first connector attached to the instrument module for mating to a backplane connector of a backplane electrically connected to traces of the backplane;
wherein the electronic instrument system operates in the first mode when the instrument module communicates through the first communications channel; and
wherein the electronic instrument system operates in the second mode when the instrument module communicates through the second communications channel, the first connector is disengaged from the backplane connector and the electronic instrument is not communicating through the first communications channel.

2. The electronic instrument system of claim 1, wherein the instrument module comprises a PCB performing a function selected from the set consisting of: DAQ, scope, function generator, source, and controller.

3. The electronic instrument system of claim 2, wherein the first communications channel uses USB protocol and additional trigger lines, and the second communications channel uses USB protocol.

4. The electronic instrument system of claim 1, further comprising a chassis, and wherein the backplane forms a portion of the chassis for plugging in the instrument module and for plugging in one or more additional instrument modules sharing the first communications channel and having second communications channels.

5. The electronic instrument system of claim 4, further comprising electrical traces in the backplane and wherein synchronization signals pass between the instrument modules along the electrical traces in the backplane.

6. The electronic instrument system of claim 1, wherein the first connector when plugged into the backplane connector transmits, through the first communications channel, USB protocol communication signals and trigger signals.

7. The electronic instrument system of claim 1, further comprising a second connector attached to the instrument module for forming the second communications channel, the second connector mating to a cable which connects the instrument module to one of the one or more processors.

8. The electronic instrument system of claim 7, wherein the second connector is a USB connector the second communications channel uses a USB protocol to communicate with the one or more processors.

9. The electronic instrument system of claim 1, further comprising a wireless transceiver for forming the second communications channel and providing communications between the instrument module and one of the one or more processors.

10. The electronic instrument system of claim 1, wherein the second communications channel comprises a USB standard connector attached to the instrument module for mating to a USB standard cable which connects the instrument module to one of the one or more processors.

11. The electronic instrument system of claim 1, wherein the instrument module further comprises a power plug for receiving power when operating in the second mode, and wherein in the first mode the instrument module receives power through the backplane and through the first connector.

12. The electronic instrument system of claim 11, wherein the electronic instrument system further comprises a power cable with an AC-DC adaptor for plugging into the power plug when operating in the second mode.

13. The electronic instrument system of claim 1, wherein the instrument module further comprises a third communications channel for linking the instrument module with an external device-under-test undergoing test or measurement by the electronic instrument system.

14. The electronic instrument system of claim 13, wherein the third communications channel comprises a bus selected from the group consisting of: USB, Ethernet, LAN, RS232, IEEE 1394, GPIB, HPIB, VXI, PCI Express, PCI, PXI, LXI and PCMCIA.

15. The electronic instrument system of claim 13, further comprising a third connector attached to the instrument module through which the third communications channel passes.

16. The electronic instrument system of claim 2, further comprising a protective instrument module casing enclosing the instrument module to protect the PCB, the protective instrument module casing including a first connector mounted thereon for communicating through the first communications channel when operating in the first mode and a second connector mounted thereon for communicating through the second communications channel when operating in the second mode.

17. The electronic instrument system of claim 16, wherein the protective instrument module casing and chassis include guide means comprising grooves and runners for constraining the instrument module to slide along the direction of the grooves and runners when inserted or removed from a slot of the chassis.

18. The electronic instrument system of claim 16, wherein the protective instrument module casing includes ventilation holes along side faces.

19. The electronic instrument system of claim 16, further comprising a housing for the instrument module for use in the second mode, the housing including a main storage compartment for holding the protective instrument module casing.

20. The electronic instrument system of claim 19, wherein the housing further comprises ventilation openings aligned with the ventilation holes of the protective instrument module casing to allow air-flow between the inside and outside of the instrument module casing.

21. The electronic instrument system of claim 19, wherein the housing covers the first connector while leaving the second connector accessible for operation in the second mode.

22. A method for operating an electronic instrument system in first and second mutually-exclusive modes of operation comprising the steps of:
  plugging a first connector of the instrument module into a backplane connector of a backplane electrically connected to traces of the backplane to operate in the first mode;
  communicating through a first communications channel when operating in the first mode, the first communications channel linking the instrument module to one or more processors through the traces of the backplane;
  disengaging the first connector of the instrument module from the backplane connector to operate in the second mode; and
  communicating through a second communications channel when operating in the second mode, the second communications channel linking the instrument module to the one or more processors.

23. The method of claim 22, further comprising the steps of:
  plugging a cable between a second connector of the instrument module and the one or more processors to form the second communications channel.

24. The method of claim 23, wherein the instrument module comprises a PCB performing a function selected from the set consisting of: DAQ, scope, function generator, source, and controller.

* * * * *